United States Patent
Poindexter et al.

(10) Patent No.: US 9,285,417 B2
(45) Date of Patent: Mar. 15, 2016

(54) LOW-VOLTAGE IC TEST FOR DEFECT SCREENING

(71) Applicant: GLOBALFOUNDRIES INC., Grand Cayman (KY)

(72) Inventors: Daniel J. Poindexter, Cornwell-on-Hudson, NY (US); James M. Crafts, Warren, VT (US); Karre M. Greene, Essex Junction, VT (US); Kenneth A. Lavallee, Colchester, VT (US); Keith C. Stevens, Fairfield, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 358 days.

(21) Appl. No.: 13/732,482

(22) Filed: Jan. 2, 2013

(65) Prior Publication Data
US 2014/0184262 A1 Jul. 3, 2014

(51) Int. Cl.
*G01R 31/00* (2006.01)
*G01R 31/28* (2006.01)
*H01L 21/00* (2006.01)
*G01R 31/30* (2006.01)
*H01L 23/00* (2006.01)

(52) U.S. Cl.
CPC ............ *G01R 31/2853* (2013.01); *G01R 31/30* (2013.01); *H01L 21/00* (2013.01); *H01L 24/00* (2013.01); *H01M 2200/00* (2013.01)

(58) Field of Classification Search
CPC ......... H01L 21/00; H01L 24/00; H01L 27/00; H01L 39/00; H01M 2/00; H01M 2200/00
USPC .................................................... 324/759.03
See application file for complete search history.

(56) References Cited

U.S. PATENT DOCUMENTS

| | | | |
|---|---|---|---|
| 5,889,408 A | 3/1999 | Miller | |
| 6,369,606 B1 * | 4/2002 | Houghton | H01L 21/823807 257/E21.633 |
| 6,563,323 B2 * | 5/2003 | Inoshita et al. | 324/523 |
| 6,777,972 B2 | 8/2004 | Roussel et al. | |
| 7,400,162 B2 * | 7/2008 | Gattiker et al. | 324/762.01 |
| 2006/0123280 A1 * | 6/2006 | Tran | G11C 11/5621 714/718 |
| 2007/0146945 A1 * | 6/2007 | Zhang et al. | 361/42 |
| 2009/0316454 A1 * | 12/2009 | Colbeck | H02M 1/4225 363/89 |

\* cited by examiner

*Primary Examiner* — Huy Q Phan
*Assistant Examiner* — Temilade Rhodes-Vivour
(74) *Attorney, Agent, or Firm* — Scully, Scott, Murphy & Presser, P.C.

(57) ABSTRACT

System and method using low voltage current measurements to measure voltage network currents in an integrated circuit (IC). In one aspect, a low voltage current leakage test is applied voltage networks for the IC or microchip via one or more IC chip connectors. One or multiple specifications are developed based on chip's circuit delay wherein a chip is aborted or sorted into a lesser reliability sort depending whether the chip fails specification. Alternately, a low voltage current leakage test begins an integrated circuit test flow. Then there is run a high voltage stress, and a second low voltage current leakage test is thereafter added. Then, there is compared the second low voltage test to the first low V test, and if the measured current is less on second test, this is indicative of a defect present which may result in either a scrap or downgrade reliability of chip.

20 Claims, 15 Drawing Sheets

LOW-VOLTAGE IC TEST FOR DEFECT SCREENING

BACKGROUND

This present disclosure relates to systems and methods for preventing defects in microelectronic integrated circuits (IC) and particularly, a low voltage IC test system and method for defect screening of ICs for the purposes of preventing defects in microelectronic circuits from getting into the field where they can cause reliability fails.

Depending on where a defect lands in the fabrication of semiconductors it is possible that the defect can cause shorting from power to ground and not affect signal lines (e.g., "shorts defects"). Thus an impacted chip can be fully functional and pass all structural and functional testing. These chips can then be sorted as a good and sold into the field. In the field the defect can continue to draw current and create localized heating. The current drawn can create increased levels of electromigration and other reliability problems. Localized heating can then, over time, damage the shorted circuit as well as microelectronic circuits in its vicinity.

Many reliability failure mechanisms are accelerated through higher temperatures, for instance electromigration (which for instance Cu is sensitive to) where electron current moves metal atoms, time dependent dielectric breakdown, stress migration, and NBTI (Negative Bias Temperature Instability).

The problem of latent electrical current drawing defects in IC's that do not create a logic fail can become reliability fails in the future (resulting in RE fails due to defect growth or by resistive/Joule heating of the surrounding circuitry accelerating other temperature driven fail modes and by electromigration), is getting more important to solve as wiring dimensions continue to shrink. Smaller wires are more susceptible to opens or shorts due to stress and electromigration which are accelerated by heat and higher current density. Smaller device/circuit spaces are more susceptible to shorting from metal being extruded due to the above stresses.

Further, it is more important to screen as much of the chip as possible. As the use of on chip voltage generators and power save mode power headers become more prevalent, there is a need to provide a technique to screen "medium" level current defects behind these generators and headers.

Conventional current leakage screens performed in microelectronic testing typically have problems that are two fold: 1) at operating voltages there is low sensitivity to "medium" level shorts defects; 2) shorts defects can have such high current densities that parts of the redundant power and ground wiring can become ablated at operating or higher voltages thus decreasing the current pulled from the power supplies but still pull enough power to cause local heating. Large chips that draw a high current have less sensitivity to relatively small current shorts defects.

Currently, it is difficult to screen these "medium current" defects that do not cause functional or power limit fails while taking a minimum in yield loss. Thus it is necessary to find a method that enhances the ability to uniquely detect these defect's for screening with a minimum of yield loss from also screening non-reliability problem chips.

This can be especially problematic in arrays or other circuits where redundancy is employed to allow chips with defective arrays or circuits to be usable in the field. Redundancy allows chips with known electrically active defects to ship to the field. These defects can also be shorting circuits together and pulling substantial currents even if they are not needed for the chip to function.

Further, current techniques for testing for defects (current leakage) in IC's includes relying on gross probe check limits and Idd (quiescent current) limits at nominal voltages by voltage network and chips to functionally fail.

BRIEF SUMMARY

It is an aspect of the present disclosure to provide a system and method of operation for detecting a class of shorts defects resulting in reliability fails.

The system and method makes use of low voltage (or "Low V") current measurements, to measure network currents and a standard parametric measure of a chip's speed or inherent current leakage level. The low voltage currents are then compared to the inherent normalized currents by ring delay and set limits to screen out mavericks. A class of short defects resulting in reliability fails shows a stronger maverick signal when tested at Low V than nominal V and are thus more detectable. Testing at Low V has the benefit of not ablating the problem defect and reducing the defect signal, and also keeps the FET and junction leakage currents low thus keeping the inherent chip leakage level low.

According to an embodiment, there is provided a method for testing integrated circuits comprising: receiving a voltage signal of a value less than a threshold transistor turn on voltage of a circuit's transistors, at one or more signal inputs of a voltage network provided in an integrated circuit; measuring a current leakage at signal connectors of the voltage network on the voltage network; comparing the measured current leakage with a pre-determined limit based on an analog or other "independent" parameter characterizing the chip, and sorting the chip based on the comparison.

According to the method, in one aspect, the analog or independent parameter is a speed of the chip, the chip speed being measurable by a circuit delay test.

In a further aspect, the circuit delay test employs a ring oscillator associated with the voltage network.

According to a further embodiment, there is provided a method for testing integrated circuits comprising: receiving a first voltage signal of a value less than a threshold transistor turn on voltage of a circuit's transistors, at one or more signal inputs of a voltage network provided in an integrated circuit; measuring a first current leakage at signal connectors of the voltage network on the voltage network; applying a high voltage stress (and or another method for accelerating failure from defects, like higher temperature) to the voltage network that is a defect accelerating voltage; receiving a second voltage signal of a value less than a threshold transistor turn on voltage of a circuit's transistors, at one or more signal inputs of a voltage network provided in an integrated circuit; measuring a second current leakage at said signal connectors of the voltage network; comparing the first measured current leakage with the second measure current leakage, and sorting the chip in response to the comparison.

In this further embodiment, the comparing of the first measured current leakage with the second measure current leakage comprises: obtaining a difference between the first measured current leakage and second measured current leakage values; and comparing the difference to a pre-specified limit, wherein when the second measured current leakage is determined significantly less or significantly more than the first to exceed the limit, the sorting comprises one or more of: aborting production of the chip, disabling the whole or a portion of the voltage domain chip, or binning the chip for less reliable use.

In a further embodiment, there is provided a system for testing integrated circuits comprising: a voltage test device supporting an integrated circuit to be tested and having connections for inputting signals to and receiving signals from the integrated circuit; a voltage source providing a voltage signal to the test device for application at one or more signal inputs of a voltage network provided in the integrated circuit, a voltage signal applied having a value less than a threshold transistor turn on voltage of a circuit's transistors, and; a current measurement device for measuring a current leakage at signal outputs of the voltage network on the voltage network; a computing device receiving the measured current leakage values, comparing the measured current leakage values with a pre-determined limit based on an analog parameter characterizing the chip, and indicating a sorting of the integrated chip in response to the comparison.

Further to this alternate embodiment, there is provided a system for testing integrated circuits comprising: a voltage test device supporting an integrated circuit to be tested and having connections for inputting signals to and receiving signals from the integrated circuit; a voltage source providing a first voltage signal to the test device for application at one or more signal inputs of a voltage network provided in the integrated circuit, the first voltage signal applied having a value less than a threshold transistor turn on voltage of a circuit's transistors; a current measurement device for measuring the first current leakage at signal connectors of the voltage network; the voltage source applying a high voltage stress to the one or more signal inputs of the voltage network that is a defect accelerating voltage; the voltage source further providing a second voltage signal of a value less than a threshold transistor turn on voltage of a circuit's transistors, at the one or more signal inputs of a voltage network provided in an integrated circuit; the current measurement device measuring a second current leakage value at signal connectors of the voltage network; and a computer system for receiving the measured first current leakage values against the measured second current leakage values and comparing the measured first current leakage values against the measured second current leakage values, and sorting the chip in response to the comparison.

BRIEF DESCRIPTION OF THE DRAWINGS

In the following, embodiments of structures and methods relating to low voltage defect screening are described with reference to the enclosed drawings.

DETAILED DESCRIPTION

In one embodiment, the system and method for low voltage defect screening includes utilizing a low voltage current measurement at the beginning of a testing sequence. In one aspect, this is done to protect tester-to-product probing hardware from harmfully high currents. In one embodiment, this applied low voltage is below the threshold voltage of the FETs in the circuits. Resolution is also helped by testing at a lower temperature where less leakage currents are drawn. The low voltage does not therefore turn on FET gated leakage paths thus making shorts defects between power and ground more detectable from the background leakage. The low voltage also decreases the current densities through the power and ground wiring to the shorts defects often preventing these wires from ablation.

In a further aspect, a current screen may then be subsequently used to sort as failures chips that have greater than a defined current limit. Current limits are normalized by a parameter that correlates with the strength of the transistors on that chip.

In one embodiment, a ring oscillator (e.g., an inverter chain) is incorporated into the chip and the frequency this ring oscillator oscillates at correlates well with FET device strength. Stronger FETs drive ring oscillators to oscillate at higher frequencies. Stronger FETs also drive higher leakage currents. So, by defining the screen limit as a normalized leakage dependent on the frequency or period of the ring oscillator gives more sensitivity to a shorts defect. Additional defect resolution can be gained by measuring the low V current as described above and then comparing it to the same test performed later in the test sequence, after standard application voltages and in some cases high voltages used for an in-situ stress of the chip are completed. If the initial test has significantly higher current than the later test it can be assumed that a defect is present and the current has reduced due to the high current densities of the application voltages and/or stress voltages stressing and causing the ablation of wires feeding the shorts.

Figure 1:
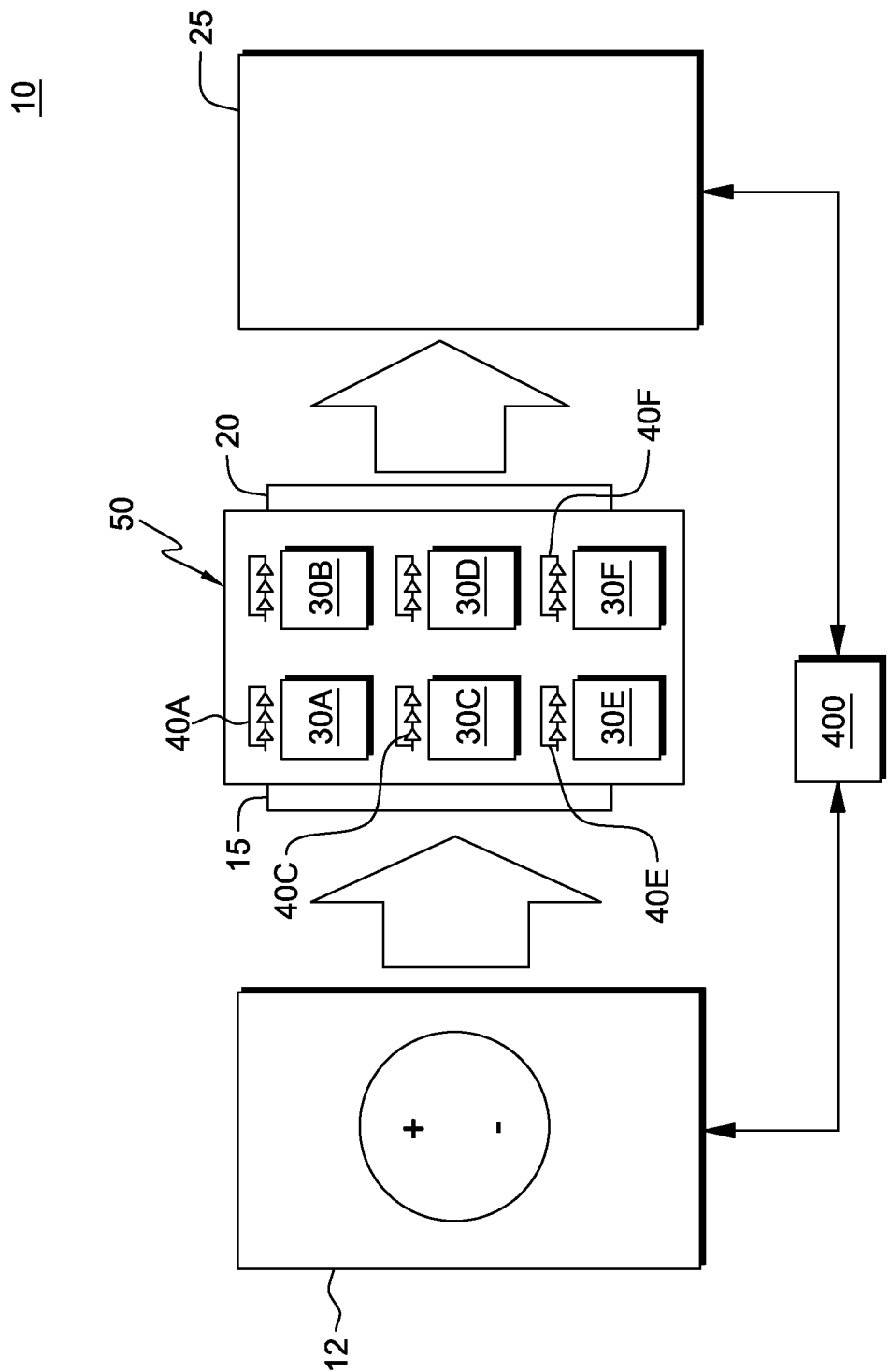
FIG. 1 shows a schematic diagram of a Low V IC test apparatus in one embodiment.

FIG. 1 conceptually depicts an IC tester 10 in which having a low voltage (Low V) pulse signal generator 12 programmed to provide a sequence of Low V signals to the power supply input pad 15 that provides connections for applying signals from the Low V pulse signal generator 12 to power supply inputs, signal inputs, and ground pins of the IC chip 50 as known in the art. It is understood that, a wafer having multiple IC chips may tested by tester 10. An output pad 20 provides connections from the IC chip to a voltage meter or like measuring device 25 for measuring the IC currents (e.g., at power, ground or signal pins or contacts) resulting from application of the low V signal supplied to the voltage domains as known in the art. In one embodiment, a computing system 400, described in greater detail herein below, is programmed to conduct the test methodology described herein. The IC 50 is shown having multiple domains 30A through 30F. It is assumed the chips being tested each include one or more Ring Oscillator (RO) devices (chain of inverters) delay circuits 40A through 40F that are also adapted to receive signals from the input pad 15 or a separate supply input. It is understood that provision of a ring oscillator for each of the voltage domains is optional; there are different kinds of FETs, e.g., Hi, Regular or Low VT (voltage threshold) devices on chip or possibly thin and thick oxide devices, any of these could have a ring oscillator w/such FETs, and its delay would be proportional to the leakage from this type of FET, or circuit made from these FETs. That is, the RO's may be powered by a separate power supply separate from the low voltage power source applying low voltage signals to the IC chip voltage domains. Alternatively, a proxy such as a single FET wired out to I/O pads may be used in place of the RO to provide a correlating analog parameter as will be described in greater detail herein below.

It is understood that an analog parameter includes a continuous parameter that correlates well with FET transistor strength or other chip leakage drivers. It is possible that a digital signal could be used to derive a continuous parameter that correlates well with the above.

In a first embodiment, the IC tester 10 of FIG. 1 is programmed to provide a low voltage current leakage test to all or some voltage networks for an integrated circuit 50 or microchip. The test can be added to all or a subset of: power, ground, and signal pins. Then, there is developed multiple specifications based on chip's circuit delay which can be subsequently used to abort or sort chip into a lesser reliability sort depending on specification fails. Alternatively, or in addition, there are developed specifications based on a Vmin voltage (minimum voltage that the chip needs to meet its frequency spec). Vmin also correlates well to a chip's direct Current (DC) leakage current. The lower the Vmin the higher the dc leakage current.

Figure 2:
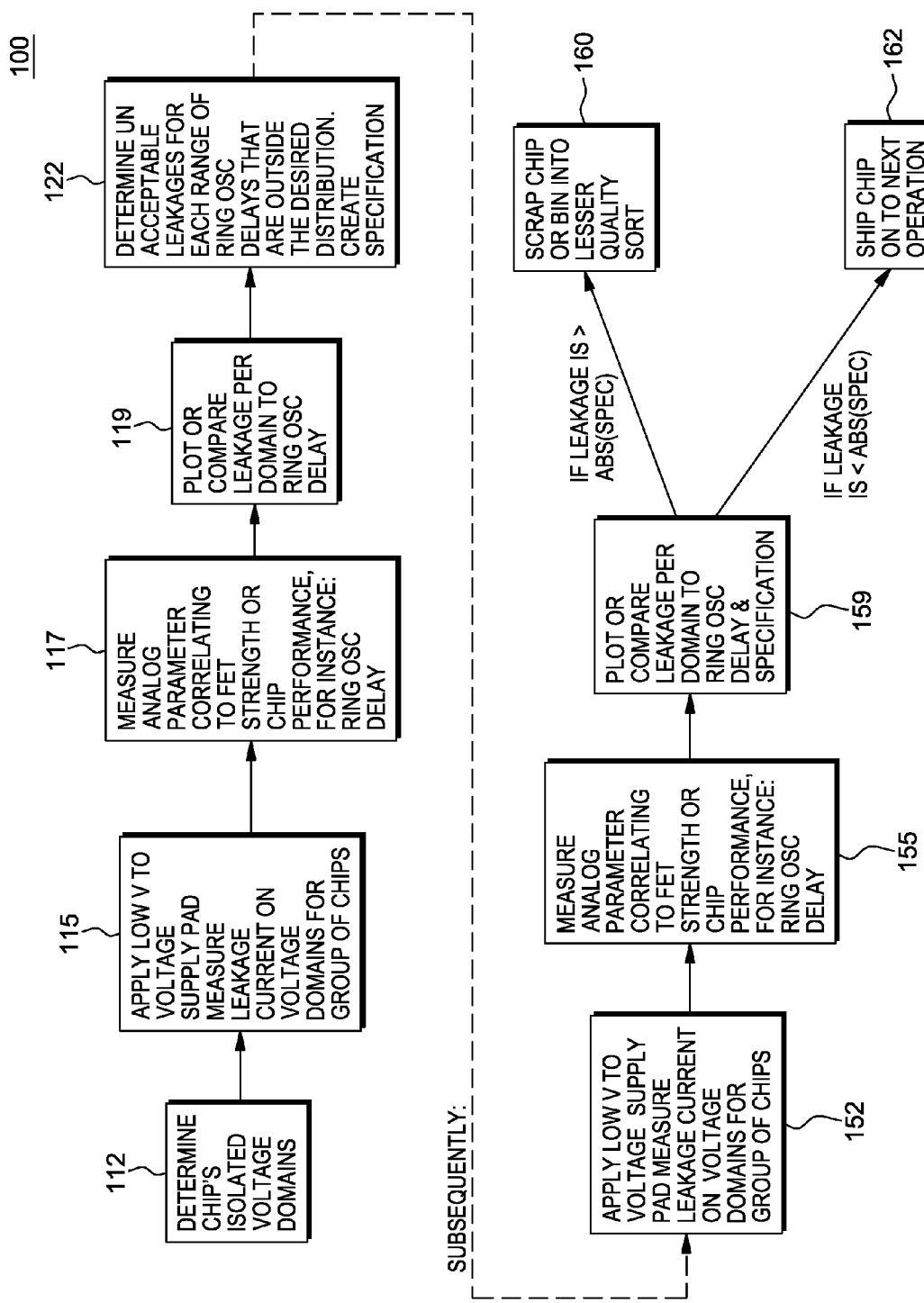
FIG. 2 is a flow chart depicting a Low V IC test method 100 performed by IC test system of FIG. 1.

FIG. 2 depicts a method 100 of Low V voltage IC testing as controlled by computing system 400 interfacing with IC tester 10 according to a first embodiment. Prior to IC testing, at 112, it may first be determined the chip's isolated voltage domain(s) to be tested. As known, an IC chip voltage domains are the electrically isolated voltage networks that provide the needed voltages across the chip, i.e., they include wires and vias to supply voltages with a minimal voltage droop to all IC circuits. One source of multiple voltage domains are different voltage levels needed by specific circuits in a chip. For instance, the I/O network typically requires a higher voltage to better drive off-chip communication. Multiple voltage domains may correspond to the breaking up of voltage networks, even if they're at the same voltage levels, e.g., a power supply may only be able to provide enough power for only a portion of the chip. As shown in FIG. 1, this voltage domain is identified or otherwise specified so that the signal source, measurement device and input/output (I/O) voltage pins are configured to receive or provide measurement signals for the IC voltage domain tester setup of FIG. 1.

Commencing a microelectronic chip test, as indicated at 115, a Low V voltage is applied to a voltage supply pad 15, and the measurement device 25 of the tester 10 is programmed to measure leakage current on the voltage domain(s) for each domain (group of chips) tested at 115. It is understood that different voltage domains supply voltage to different quantity and types of transistors which causes different levels of leakage. Thus there may be many electrically isolated voltage domains (e.g., islands) and the testing performed determines how much leakage is on each of them.

In one embodiment, a sequence of low voltage signals (e.g., voltage less than the threshold voltage of the chip's transistors) is applied to the power and ground contacts for each of the voltage domains on the chip. In one embodiment, a pulse train is often supplied to many pins at the same time. Typically on a large chip there are a large number of voltage and ground pins to provide constant voltage across the chip without taking IR (Resistance * Current) drops. One example application may include 100 mV low V DC signals as being effective for a 0.8 to 1.3V application voltage sub 100 nm technology. Generally, the applied low voltage is less than the threshold voltage for turning on a transistor, e.g., less than 200 mV.

After measuring at the power supply pad for each domain(s), the current supplied to the domain at 115, there is performed the analog testing of transistor device strength, and determining analog parameters that strongly correlate to FET transistor strength or chip performances measured at 117 of the test sequence. In one embodiment, for instance, this includes measuring an analog parameter, a Ring Oscillator (RO) delay (or an average delay of all RO chain rings measured for the chip), or measuring any other analog parameter that correlates well with the FET transistor strength (Vdd 0 network) leakage. Then, for each chip, there is normalized out the low voltage transistor chip leakage effect. Then, there is generated a plot of the low V leakage measurement results vs. the Ring Oscillator delay for each IC at 119 as shown in FIG. 3 and FIG. 4.

As there is variability in the strength of FET, for a given lot of wafers, there may be significant deltas in terms of transistor strength (normally distributed). For example, a stronger FET transistor will exhibit greater leakage than a weaker FET which will leak less. The Ring oscillator provides a delay indicative of how the chip or IC function will perform under various operating conditions. Given the strength of an inverter stage and load, the RO will have a given delay. A stronger FET results in a shorter RO delay, and a weaker FET results in a longer delay. So the ring oscillator delays for an IC provide a distribution, and the leakage performance of a chip domain is measured against the distribution.

Figure 3:
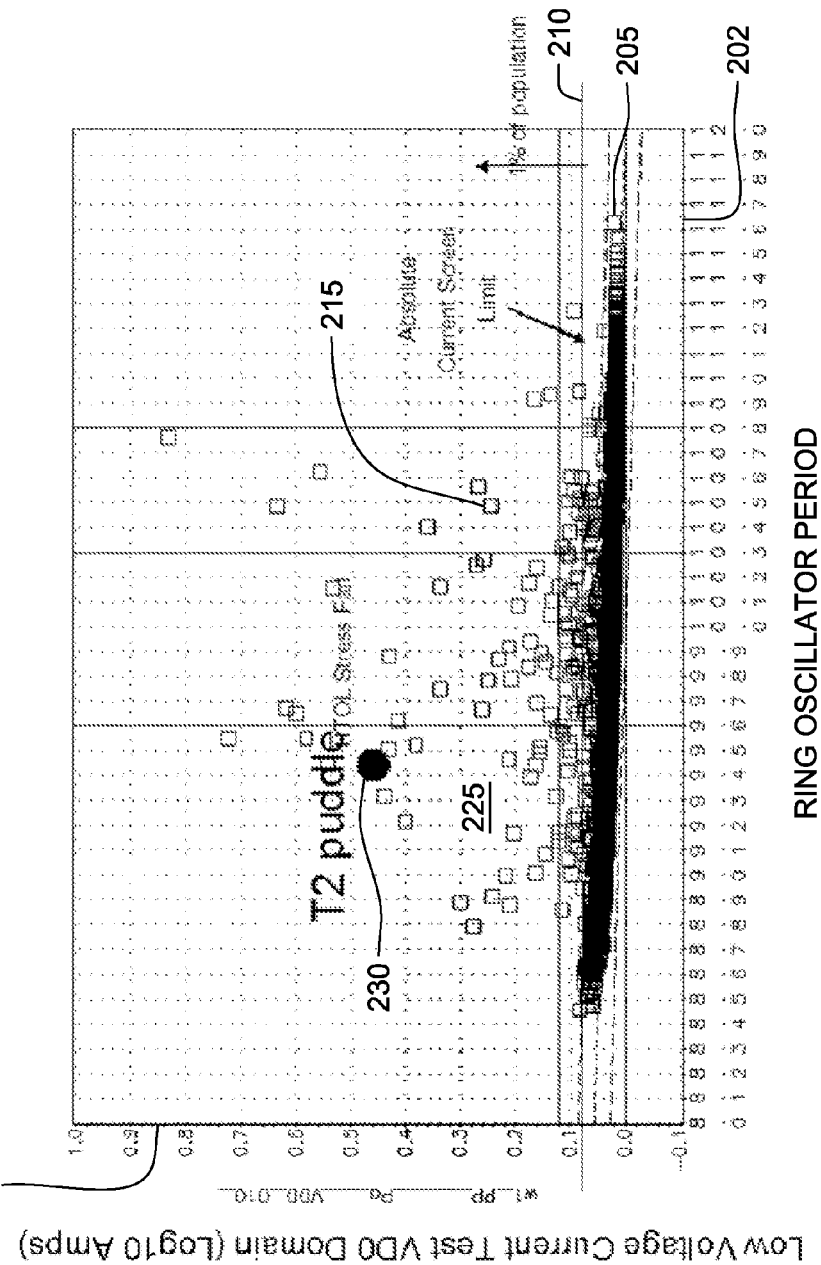
FIG. 3 shows an example plot of IC low V leakage measurement results correlating with the measured Ring Oscillator delay for the IC.
Figure 4:
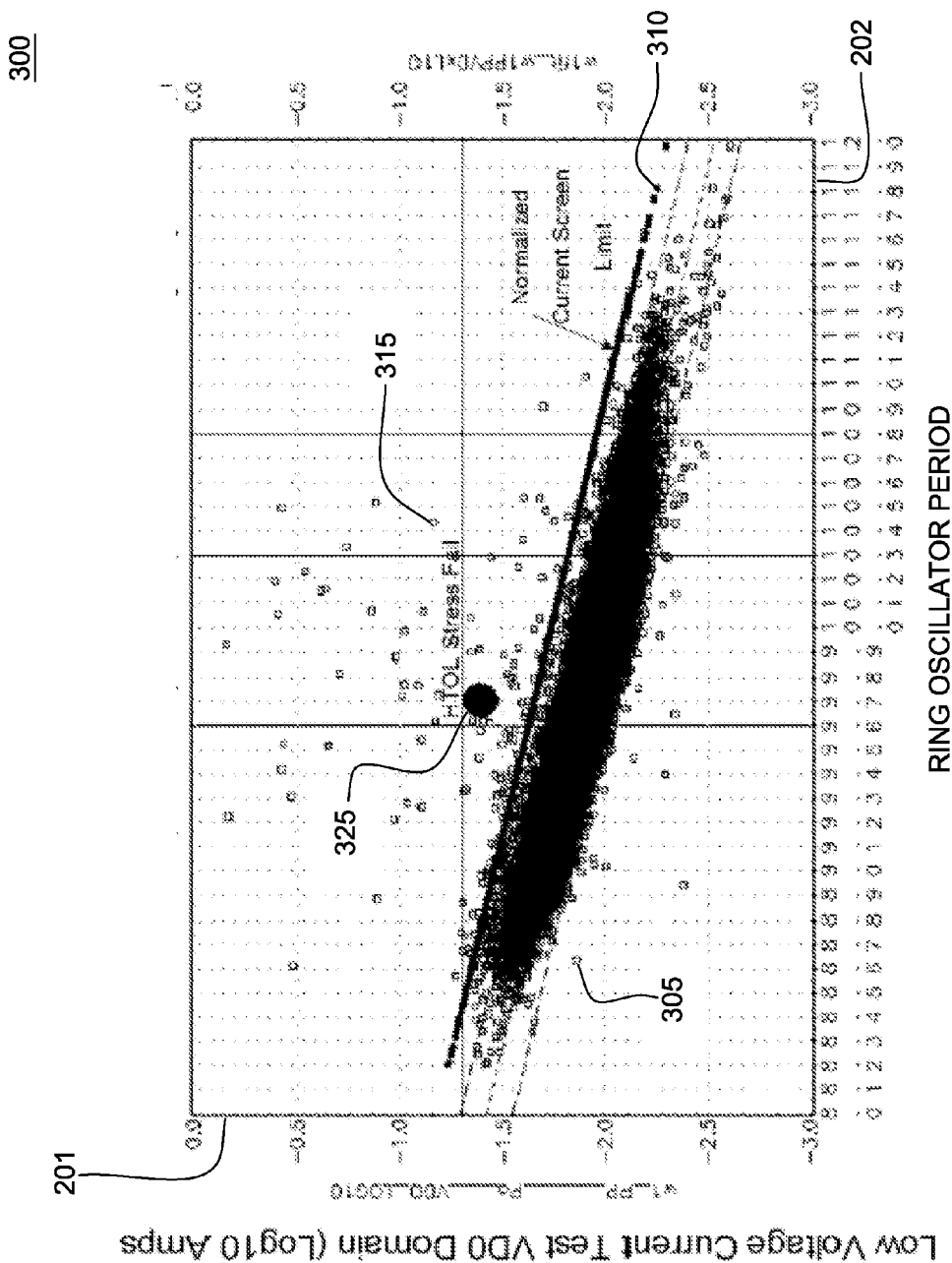
FIG. 4 illustrates another example plot of actual current Leakage vs. RO Delay data from an IC being tested.

FIG. 3 shows an example plot 200 of Low Voltage testing current applied to a voltage domain input, e.g., a Vdd pin of the chip, versus a ring oscillator delay period (or average of measured RO delay periods) for that chip. Particularly, the actual leakage current measured (the Low V leakage/current (in Amperes) measured on the VDD voltage domain) for each IC (chip) is plotted as an element 205 on Y-axis 201 as a function of the ring oscillator delay data for that (IC chip) domain where the average delay per stage (e.g., picoseconds) of a group of ring oscillators measured on each chip is shown on the X-axis 202. Each element labeled 205 is the value for a chip. A horizontal line 210 represents an absolute screen leakage current limit, i.e., a specification limit. As shown in the example plot 200 of FIG. 3, the absolute screen limit is a constant value (specification) across the X axis (RO Delay). The current leakage boxes 215 above the specification limit would be chip violators of this specification limit. The area indicated 230 above the specification limit represents a failure after product stress qualification, i.e., a potential field fail. Longer delays which correlate with weaker FETs obtain lower leakage current. This is important because there is large current difference between the absolute specification limit 210 and the non-defective chip leakage 205 for longer RO delay periods. As the correlation between FET strength to RO delay is good, it can be used to normalize out the effect of the lower leakage for weaker FETs.

In one embodiment, the Low V screen test limits can also be set to screen out chips that are clearly in a defect tail that is above the normal distribution of currents. There may be a trade off between chip yields (percentage of good chips) and how close the current limit is to the normal distribution of currents or how thorough the reliability screen is at screening out shorts defects.

FIG. 4 illustrates another example plot 300 of example current Leakage vs. RO Delay data from an example IC being Low V tested. The Y-axis is the Low V leakage/current (Amps) measurement of the VD0 voltage domain and the X-axis is the average delay per stage (picoseconds) of a group of ring oscillators measured on each chip. Each element 305 is the value for a respective chip. The line marked normalized screen limit 310 is the specification limit, meaning normalized by the Ring Oscillator delay, and elements 315 above the specification limit would fail this specification. The element 325 labeled HTOL Stress Fail is for an example chip ending up being a failure after product stress qualification (constituting a potential field fail in this example, if it was not screened by the method of FIG. 2). In is understood that FIG. 3 illustrates an example of a fixed Specification (not varying w/RO delay) and FIG. 4 illustrates an example of a specification that is normalized by RO delay.

Returning to FIG. 2, after plotting the current leakage per voltage domain to Ring Oscillator Delay at 119 wherein the absolute current level (see FIG. 3), or a normalized by transistor strength current level (see FIG. 4) for each chip may be compared to the absolute screen specification limit for that chip (see FIGS. 3 and 4), at 122, FIG. 2, there is determined unacceptable current leakage levels for each range of ring oscillator delays that are outside the desired (normal) distribution. From this, a specification (to normalize out the impacts of the FET strengths) is then created. For example, the "absolute" current leakage limit (FIG. 3) and the other "normalized" current leakage limit (FIG. 4) may be set as a limit above which IC chips having measured Low V leakage currents for a particular RO delay will fail. The limits may be determined by a variety of statistical means. One example of this would be to create a subset of measurements by delay ranges and then calculate the standard deviation for points within the range, and a 3-sigma value obtained to provide the limits to look for the outliers in that range.

As further shown in FIG. 2, a process is subsequently (routinely) used to screen out, or scrap, chips that are subsequently measured to have greater than the specified current limit for a given ring oscillator delay. That is, after setting up the screen limit, in practice, during manufacturing, for each chip manufactured, there is performed: applying the Low V to that voltage domain or a group of chips at 152; measuring the analog parameter correlating to FET strength or chip performance, e.g., Ring Oscillator Delay at 155; and at 159, measuring, for the obtained analog parameter (e.g., RO) value (X-axis), what the specification leakage current limits are by plotting or comparing the leakage per domain to Ring Oscillator delay and specification limits. Then a determination is made as to whether the measured current leakage value is greater than the X-axis value and can be sorted out 1 t 160, e.g., for scrap or for binning into a lesser quality sort, and/or disabling the leaky portion of the chip during operation if a chip is determined above the current limit, or for shipment or progression to a further operation at 162 if the chip is determined below the current limit. The current limit is set such that it will screen out shorts defects that are detected in reliability stresses used during a reliability qualification of a manufactured chip.

Figure 5:
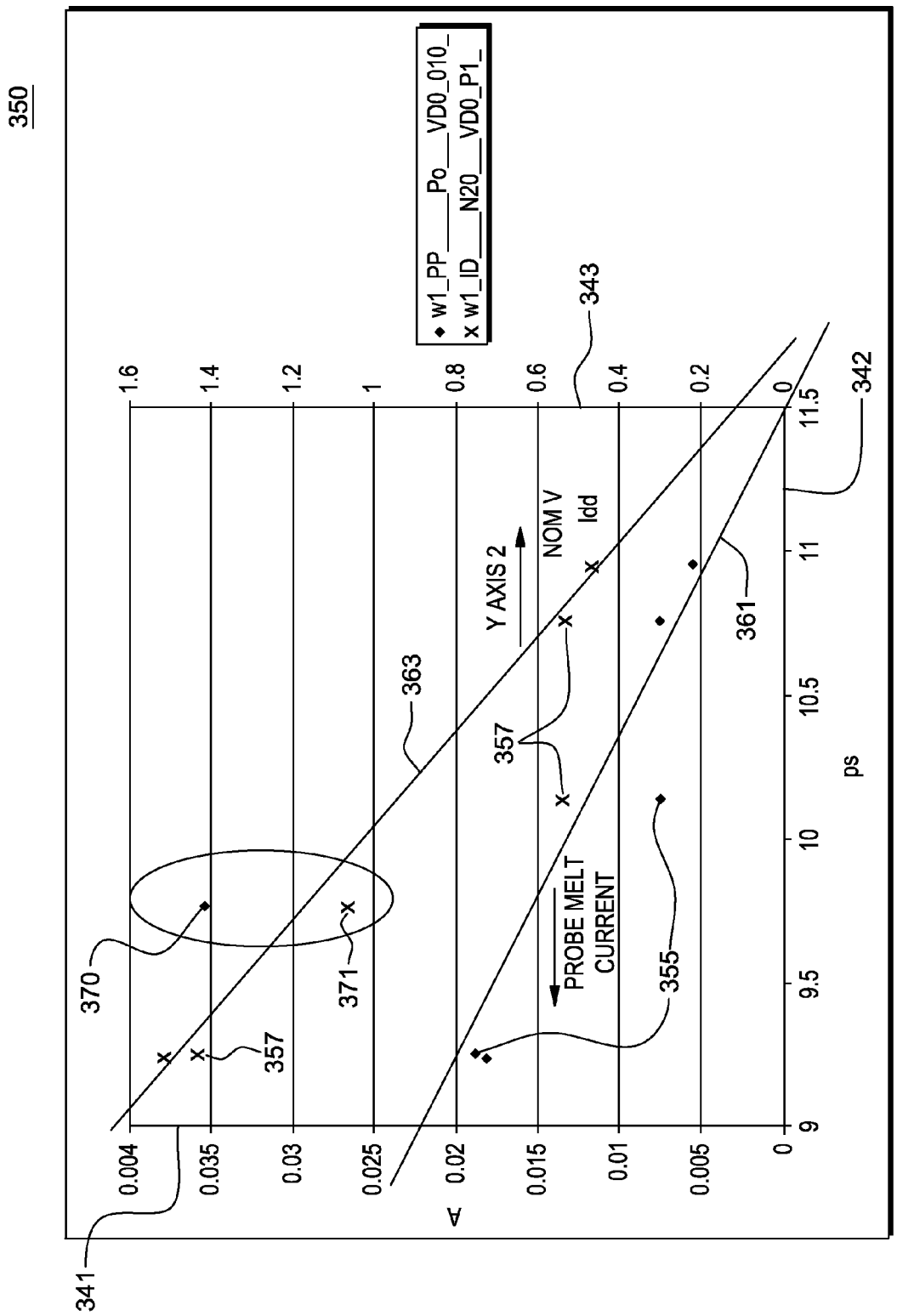
FIG. 5 illustrates a plot showing a HTOL (High Temperature Operation Life) fail and leakage current for low voltage and nominal voltage test conditions.

As mentioned, a Low V (<Saturated threshold voltage, or about 100 mV) condition provides better resolution for screening out leakage defects (probe melt) than under nominal voltage conditions. FIG. 5 shows a plot 350 of an example stress fail condition with the elements 355 indicating probe melt current (i.e., low voltage current) value (low voltage) values; and the "x" values 357 are the nominal values (currents measured at a nominal voltage).

FIG. 5, plot 350 particularly shows a HTOL (High Temperature Operation Life fail and leakage current for probe melt and nominal voltage conditions. In FIG. 5, there is an example of a stress (HTOL) fail, e.g., a metal puddle defect. Prior to any high V and high temperature stress conditions being applied, currents were measured at low V as indicated by line 361 against Y-Axis current values (amperes) 341, and nominal V as indicated by line 363 against Y-Axis current values 343, and both lines plotted against circuit speed (ring oscillator delay) along X-axis 342. The results from six (6) chips, neighbors on a wafer, show that the Low V current for the stress fail is significantly off the trend line while at nominal conditions it remains in trend.

Trend line 361 is a rough fit to the data point elements for the (low voltage) probe melt current value; and trend line 363 is a rough fit to the data point elements for the currents (amperes) measured at a nominal voltages. As shown, the Y-axis 341 indicates a scale for the current values (in amperes) for the currents measured at the low voltage probe melt current values trend line 361, while the Y-axis 343 indicates a different scale of current values (in amperes) for currents measured at the nominal voltage values trend line 363; and the X-axis 342 shows the Ring Oscillator delay. Two encircled values 370, 371 represent the same chip and same voltage domain measured at two different voltages (low voltage 370 and nominal voltage 371). The element 370, shown encircled in the plot of FIG. 5, corresponds to a VD0 probe melt value that is significantly off-trend when measured at current low-voltage scale 341 as it is significantly far from the trend line 361. The element 371 corresponds to a VD0 Nominal value that is measured at current nominal operating voltage scale 343 it is below trend line 363 and the leakage would not be found significant.

In a further embodiment, there is developed one or a multiple of specifications based on an IC chip's circuit delay. The system and method makes a determination whether to abort or sort chip into a lesser reliability sort depending on if it fails a specification. Alternatively, the specification limits may be developed based on a Vmin voltage (i.e., a minimum voltage that chip functions at its frequency specification).

Figure 14:
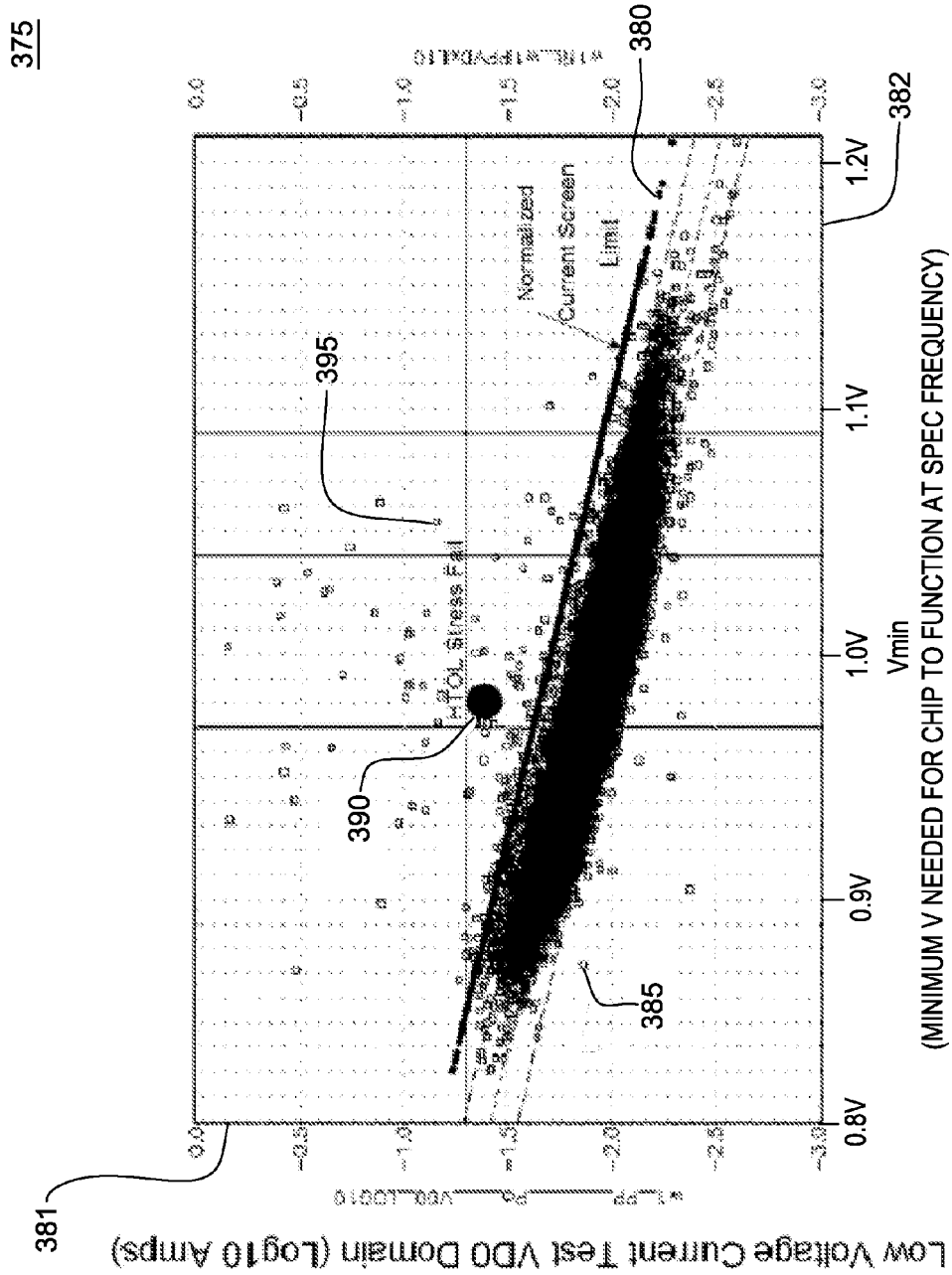
FIG. 14 illustrates an example plot of actual current Leakage vs. Vmin data from an IC being tested.

FIG. 14 illustrates an example plot 375 of actual current Leakage vs. Vmin voltage data (i.e., a minimum voltage that chip functions at its frequency specification) from an IC being tested. In the plot 375 of FIG. 14 the Y-axis 381 is the Low V leakage/current (Amps) measurement of the VDD voltage domain, and the X-axis 382 is the average Vmin (voltage) measured on each chip. Each element 385 is the value for a respective chip. The line marked normalized current screen limit 380 is the specification limit, meaning normalized Vmin voltage, and elements 395 above the specification limit would fail this specification. The element 390 labeled HTOL Stress Fail is for an example chip ending up being a failure after product stress qualification (constituting a potential field fail in this example, if it was not screened by the methods described herein.

In a further embodiment, there is added a low voltage current leakage test to beginning of integrated circuit test flow. Then there is run a high voltage stress and a second low voltage current leakage test is added. Then, there is compared the second low voltage V test to the first low V test, and if the absolute difference between the measured currents is significant, this is indicative of a defect present which may result in either a scrap or downgrade reliability of chip.

Figure 6:
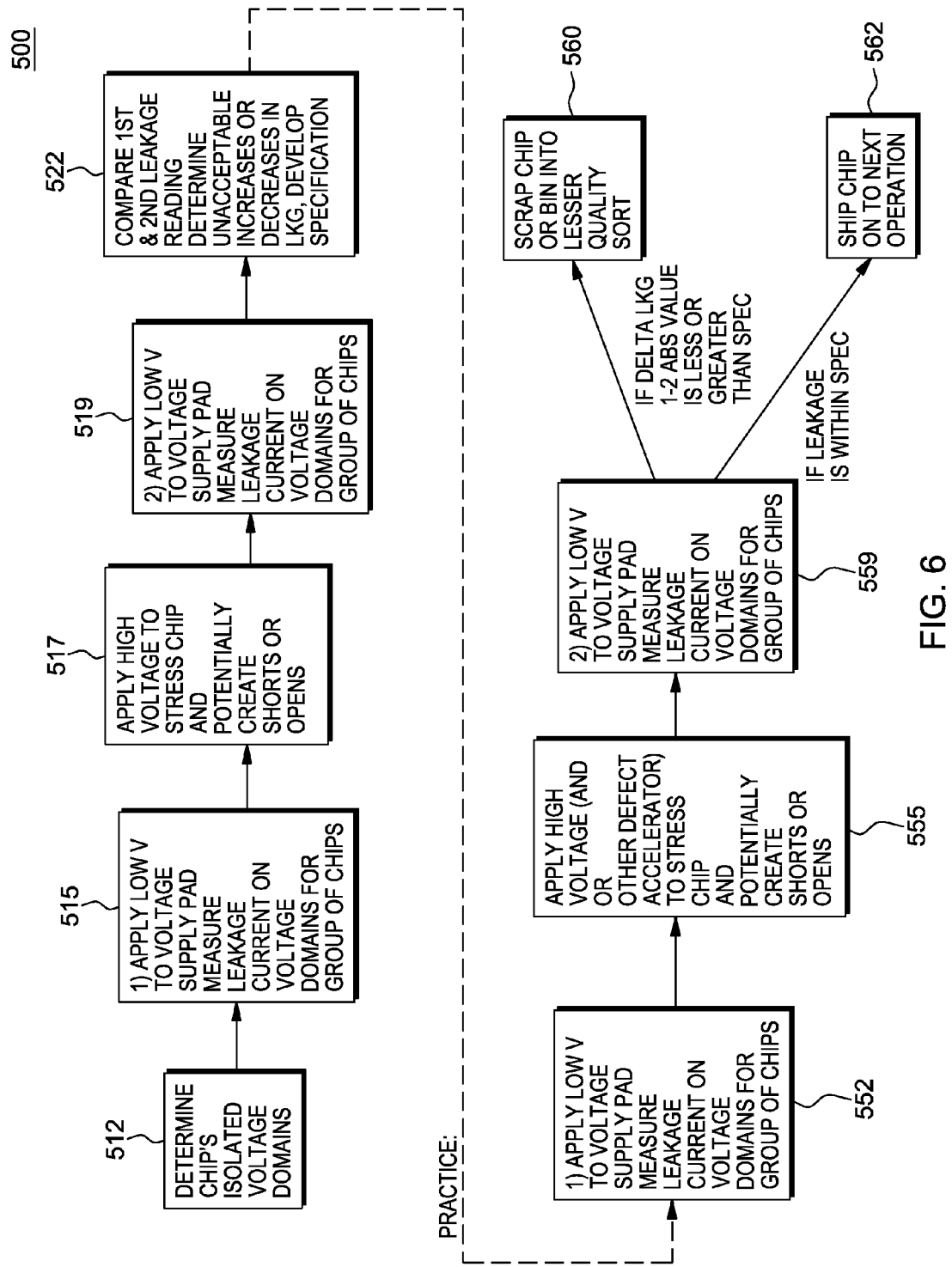
FIG. 6 depicts a method 500 of Low V IC testing according to a further embodiment.

FIG. 6 depicts a method 500 of Low V IC testing according to a further embodiment. Prior to IC testing, at 512, it may first be determined the chip's isolated voltage domain(s) to be tested. As in the prior first embodiment, commencing a microelectronic chip test, as indicated at 515, includes applying a Low V voltage to the voltage supply pad of the IC tester, and the measurement device of the tester is programmed to measure leakage current on the voltage domain(s) for each domain (group of chips) tested at 515. The low V voltage test applied may range anywhere less than a transistor threshold voltage, and may be about 100 mV or less. Then at 517, there is performed applying a high voltage to Stress chip and potentially create shorts or opens (circuit defect). In one embodiment, a high stress voltage applied may be a defect accelerating voltage, e.g., 500 mV over nominal power supply voltage of 1.2 Volts, for example, (i.e., 1.7 volts) applied, for a pre-determined duration. Then, at 519, there is again applied a Low V to voltage supply pad and the leakage current measured on voltage domains for group of chips. Then, at 522, there is performed comparing the first and second leakage current value readings and determining unacceptable increases or decreases in leakage from which there may be developed a specification. Subsequently, after setting up the screen limit, in practice, during manufacturing, for each chip manufactured, there is performed: applying the Low V to that voltage domain or a group of chips at 552 and measuring the leakage current on the voltage domain(s) for each domain (group of chips) tested; then, at 555, applying a high voltage (and/or other defect accelerator like higher temperature or temperature cycling) to stress the IC chip and potentially create a defect in the IC (e.g., include shorted copper lines together (short circuit), or the defect may be an electrical fuse (open circuit)); and at 559, again applying a Low V to the voltage supply pad and the measure the leakage current on voltage domains for the group of chips. Finally, a determination is made as to whether a difference between the first and second measured current leakage values is less than or greater than the specification. If the difference between the first and second (low V) leakage current values are outside the specification then the chip can be sorted out at 560, e.g., either for scrap, for binning into a lesser quality sort, or for re-working to disable a whole or a portion of said domain contributing to said current leakage (e.g., when in operation). If the difference between the first and second (low V) leakage current values are outside the specification then the chip may be transported or shipped for further operations at 562. The high voltage stress applied is of a value that increases possibility to form an electrically active defect in an IC such that by simply comparing the before-stress and after-stress low V voltage current leakages, the method will be able to screen out shorts defects that are detected in reliability stresses used during a reliability qualification of a manufactured chip.

Figure 7:
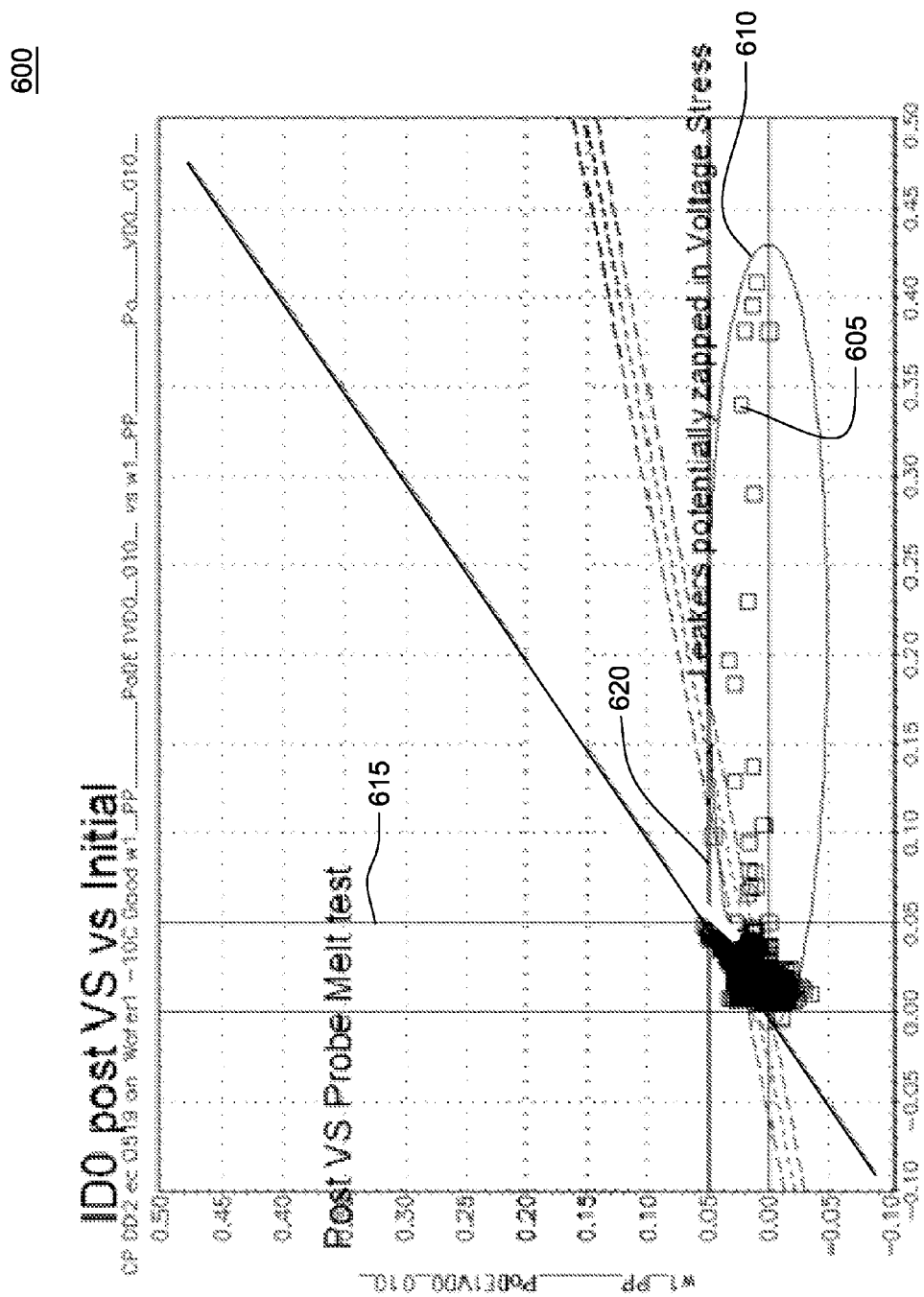
FIG. 7 is an example plot 600 depicting how current differences between an initial low voltage test and a low voltage test later in the test sequence can be compared to get more resolution.

FIG. 7 is an example plot 600 depicting how current differences between an initial low voltage test and a low voltage test later in the test sequence can be compared to get more resolution on a defect's presence. In FIG. 7, the X axis represents the current drawn (Amps) as measured as a result of applying the initial first Low V voltage (probe melt) current test on the VD0 voltage domain; the Y axis represents the current drawn (Amps) as measured after applying the second first Low V voltage (probe melt) current test on the VD0 voltage domain performed after full application voltage and stress (i.e., defect accelerating) voltages to accelerate defects have been applied. One characteristic of defect here are parasitic defects that pull current but do not stop the chip from working. It is shown in FIG. 7 how many chips 605 show a significant reduction in the drawn current after application of the second Low V test. That is, chips 605 are flier points, i.e., chips whose leakage dramatically decreased after the High Voltage stress. These classes of chips 610 had a lot of leakage initially as shown, and after application of high stress and then the second Low V measurement, those chips 605 came back down to the normal currents. In this example, it may be the case of a blown filament that could be ablated with enough current to open a circuit. These chips are considered as not reliable however, and will be sorted by this screening technique. The two lines 615 and 620 define a potential specification that would cause screening of chips with leakages measured higher than those values.

In some current IC chips, there are provided power save modes that often have integrated Power Header circuits which disconnect the voltage supply power from certain areas of the chip. Moreover, in some IC chips, on-chip voltage generators are provided that are used to supply circuits needing different voltage levels like DRAM arrays with word line and bit line voltages.

To allow Low V screening methods as described herein with respect to FIG. 2, 6 to cover more critical area for chips using on-chip power headers (to isolate a voltage network) or internal on-chip voltage generators (e.g., charge pumps or voltage regulators) one option is to design power headers and voltage generators on a separate voltage network (e.g., a voltage domain) so that they can be configured by scanning in settings (e.g., latches in chip that need to be set to scan for applications) at nominal voltage on their own voltage network (i.e., can be a test only isolated network that is shorted to larger networks at module build) and design in a configuration that allows the chip's main voltage networks to be shunted through the power header or voltage generator with a low resistance connection.

Figure 8:
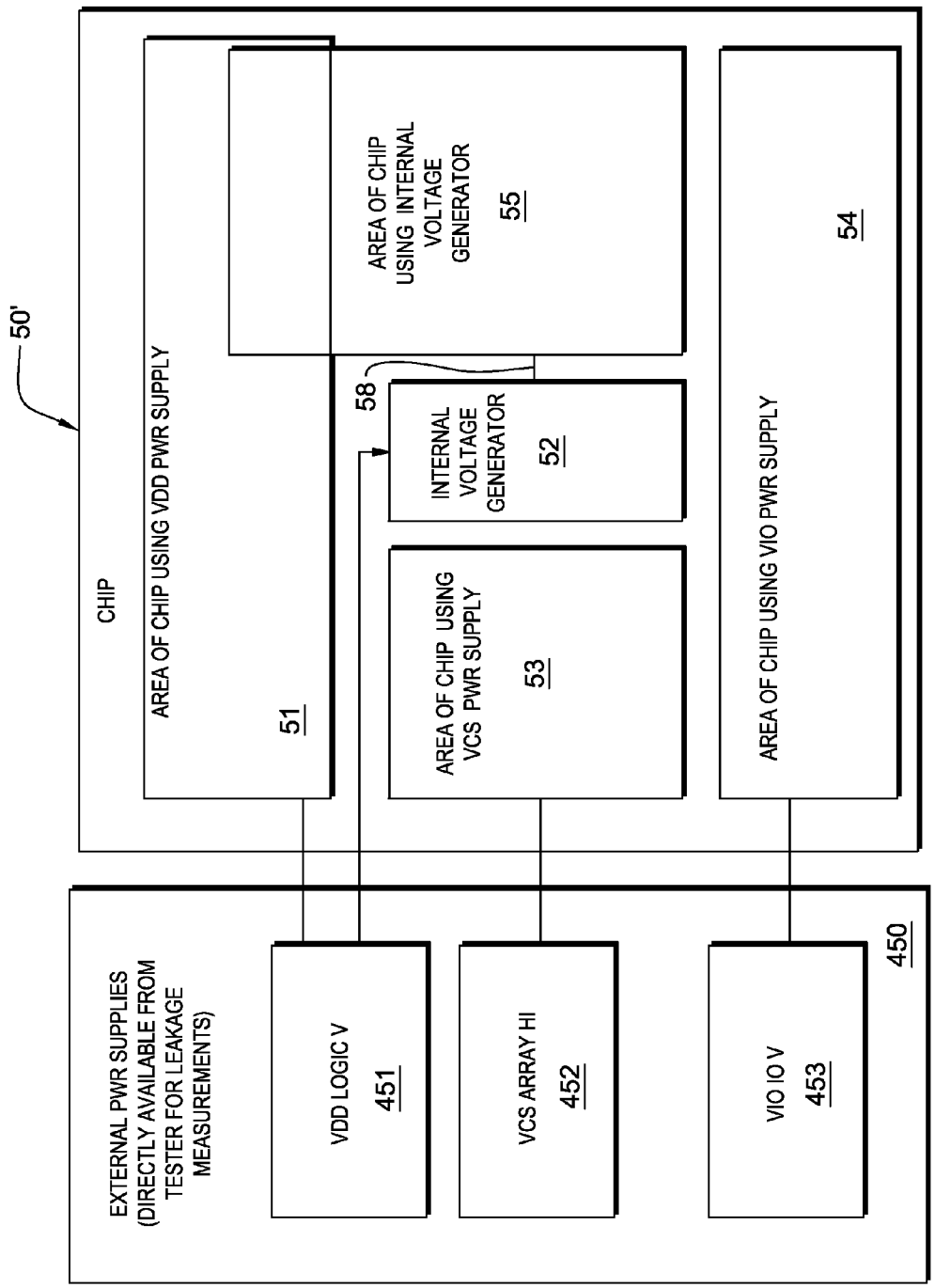
FIG. 8 shows an Low V screening method wherein the IC chip to be tested includes on-chip voltage generators according to a further embodiment.

FIG. 8 shows a Low V screening method example wherein the IC chip to be tested includes on-chip voltage generators according to a further embodiment. As shown, a voltage test pad 450 connects with external power supplies (directly available from the tester for leakage measurements). The IC chip itself 50' includes certain functional areas including: an area of chip 51 using Vdd Power Supply; an area 52 of the chip providing an internal voltage generator; an area 55 of the chip using generated internal voltage; an area 53 of the chip using a Vcs Power Supply voltage; and an area 54 of chip using a Vi/o Power Supply voltage.

As shown in FIG. 8, the test pad 450 connects with the following external power supplies (such that test voltages are directly available from the tester for leakage measurements): a Vdd power supply 451 for supplying voltages that supply circuits for the chip area 51 using Vdd power voltages, and supplying voltage for the internal voltage generator chip area 52 via an internal chip conductive line 70; a Vcs power supply voltage 452 for powering gate array (e.g., a Hi logic level) to that chip area 53 using the Vcs Power Supply voltage; and Vi/o power supply supply 453 providing voltage for signal Input/Output elements at chip area 54. As seen in the IC 50', a conductive element 58 connects the internal voltage generator chip area 52 to the area 55 of the chip using generated internal voltage supply. As shown in FIG. 8, the internal Voltage generator is normally isolated in area from tester power supplies.

As mentioned, in a further embodiment, to provide low voltage testing of the internal generator, 52 and chip area circuitry 55 using the internal generated voltage from generator 52, the chip's internal voltage network is shunted through the power header or voltage generator with a low resistance connection.

Figure 9:
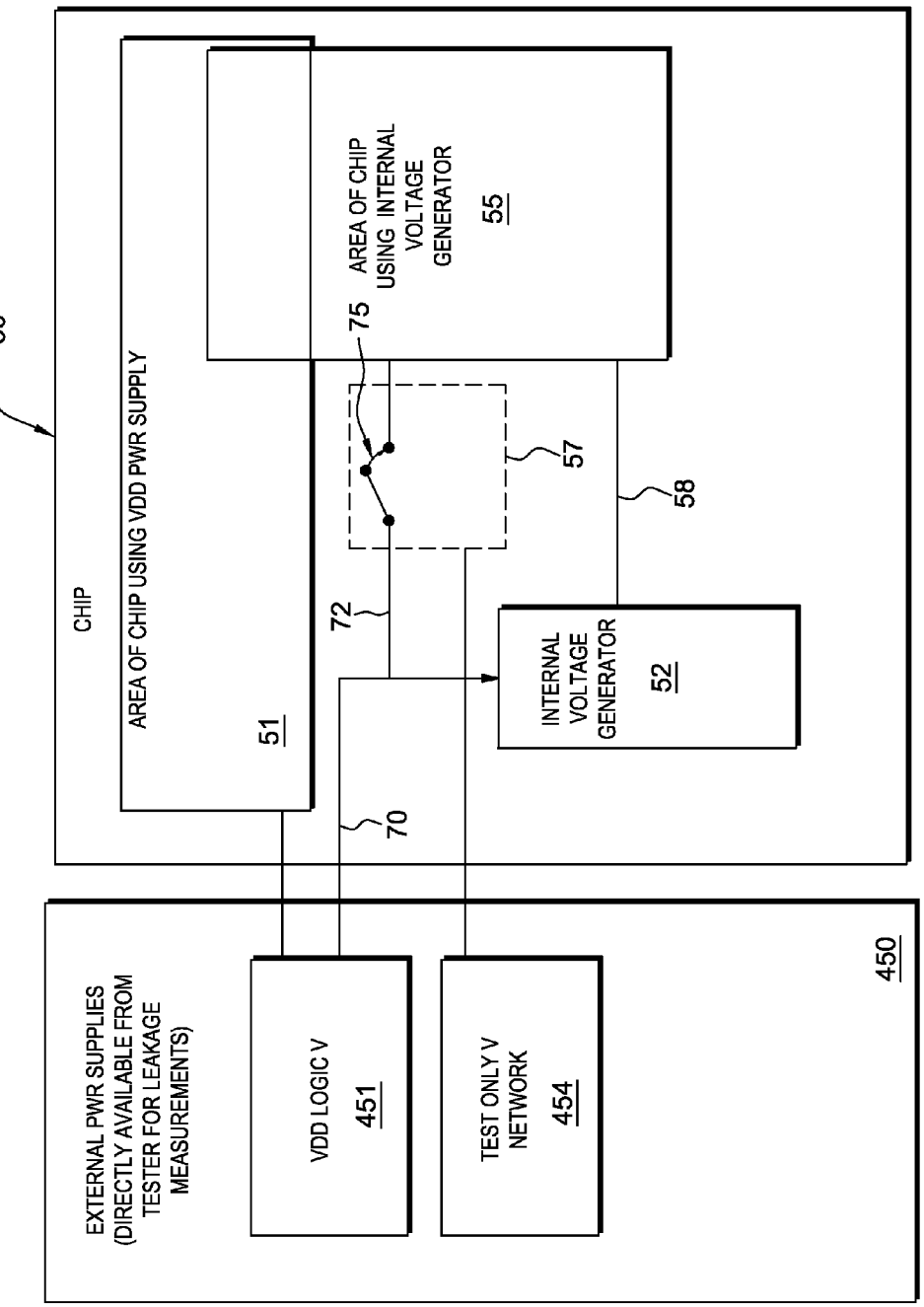
FIG. 9 shows example circuit modifications to enable shunting of voltage generators for Low V defect screening the chip.

FIG. 9 particularly shows the testing configuration for Low V testing of the chip 50" that includes internal voltage generator 52. In the chip embodiment, IC chip 50" includes new logic circuit 57 that implements logic to shunt isolated internal voltage supply 52 such that an external tester supplied voltage from an available network tester Power Supply 454, e.g., at the tester voltage pad, is provided. For example, the IC chip 50"'s internal conductive line 70 includes a further conductor 72 and series switch element 75 that is programmed by logic circuit 57 to provide the shunt for connecting the available tester supplied Low V power supply voltage to the circuit area 55. The logic circuit 57 causes switching of the switch 75 so that a Low V voltage may be applied to the circuit area 55 to conduct Low V defect screening tests as described herein.

Figure 10:
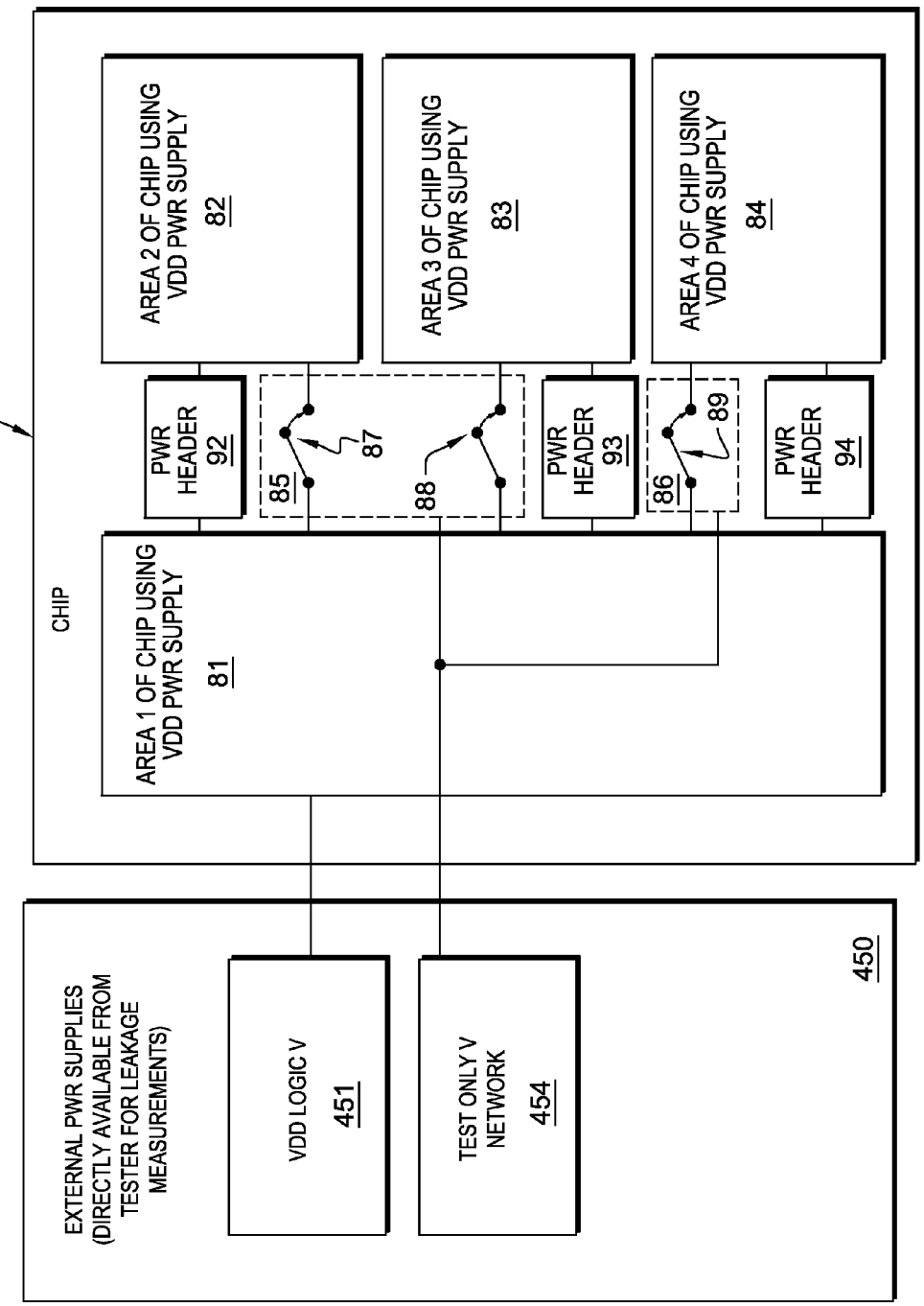
FIG. 10 shows example circuit modifications to enable shunting of on-chip power header circuits for conducting a Low V screening method to an IC 80 according to a further embodiment.

FIG. 10 shows a Low V screening method example wherein the IC chip 80 to be tested includes on-chip power header circuits according to a further embodiment. The IC chip itself 80 includes certain functional areas including: an area of chip 81 that receives the Vdd power supply voltage 451. As further shown, are several other chip circuit areas, e.g., chip area 82, 83 and 84 that normally each receive power from the Vdd power supply via the intermediary of respective internal power headers 92, 93 and 94 that provide the voltage supply power directly from chip area 81. It is understood that the Power Headers 92, 93 and 94 are normally isolated in area from the tester power supply.

In the embodiment depicted in FIG. 10, there is provided logic 85, 86 configured to shunt around Power Header and to connect the Power Header area directly to tester available power supply 451. For example, the IC chip 80 includes a further conductor from chip area 81 to the logic circuit 85 in order to control switching of respective switches 87, 88 such that respective power headers 92, 93 may be shunted around, and that tester power supply 451 may be switched in to provide Low V testing of test circuits in respective chip areas 82, 83 avoiding the power headers. Similarly, the IC chip 80 includes a further conductor to conduct voltage supply power from tester power supply 451 via chip area 81 to the logic circuit 86 in order to control switching of respective switch 89 such that respective power header 94 may be shunted. With the circuit configuration of FIG. 10, and programmed chip logic, external power supply 454 (directly available from the Tester) can be used to power the logic circuits in 85 and 86 (which require nominal voltage to operate correctly) and allow the shunting of the power headers 93, 93 and 94 and allow Low V leakage measurements at power supply 451.

Figure 11:
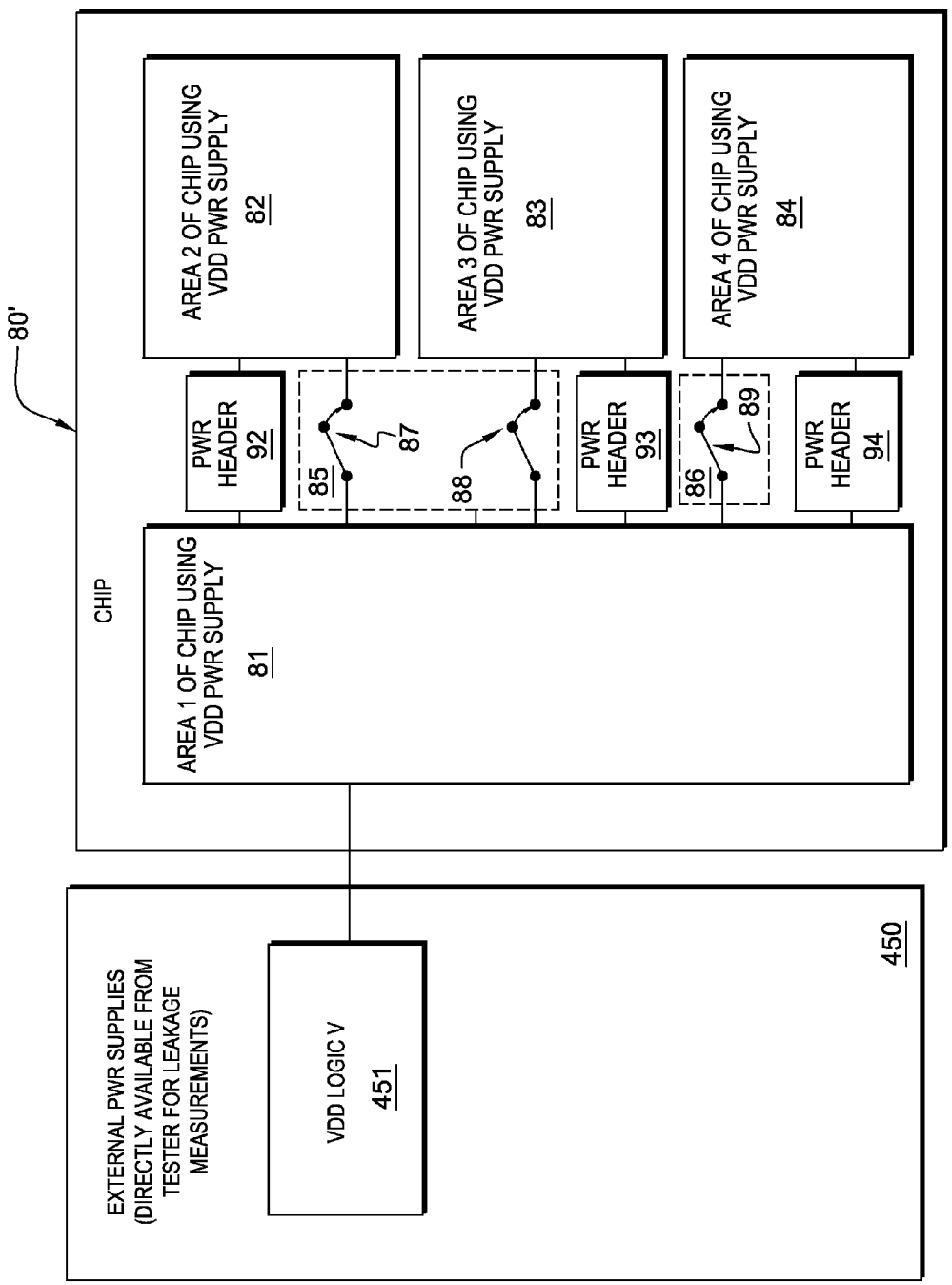
FIG. 11 shows an Low V screening method wherein the IC chip 80 to be tested includes on-chip power header circuits as in the chip 80 of FIG. 10.

FIG. 11 shows a Low V screening method example wherein the IC chip 80' to be tested includes on-chip power header circuits as in the chip 80 of FIG. 10. However, according to a further embodiment tester power supply 454 is not available as part of the tester, and consequently there is no connection from the internal of the chip 80' to that power supply. Rather, logic circuits 85, 86 provide power supply voltage from the Vdd power supply 451 to chip circuit areas via the switching of logic switches 87, 88 and 89 for low V defect testing of respective chip areas 82, 83 and 84 by shunting around power headers 92, 93, 94.

In an alternate embodiment, the on-chip power headers and voltage generators can be designed such that there is a low resistance path from their internal networks to the main voltage networks at Low V. By using these circuit modifications and setting power headers and/or voltage generators to a shunted mode, the chip may be screened for defects with Low V as described herein with respect to FIG. 2.

Furthermore, it is possible to enhance the resolution capability of the screen to find current defects by comparing leakage currents from different instances of voltage networks across a chip or wafer. This can allow finer resolution because the other leakage mechanisms, such as junction leakage and sub-threshold leakage vary from lot to lot, wafer to wafer, and chip to chip. This technique thus allows those to be normalized out.

For example, on a multi core chip, the Low V currents between cores may be measured, and if a core is found to have significantly higher leakage than its neighbors, it can be screened. Screening in this case may include down binning the chip to be a "−1" core sort, and where possible shutting down power to this core during chip operation.

Figure 12:
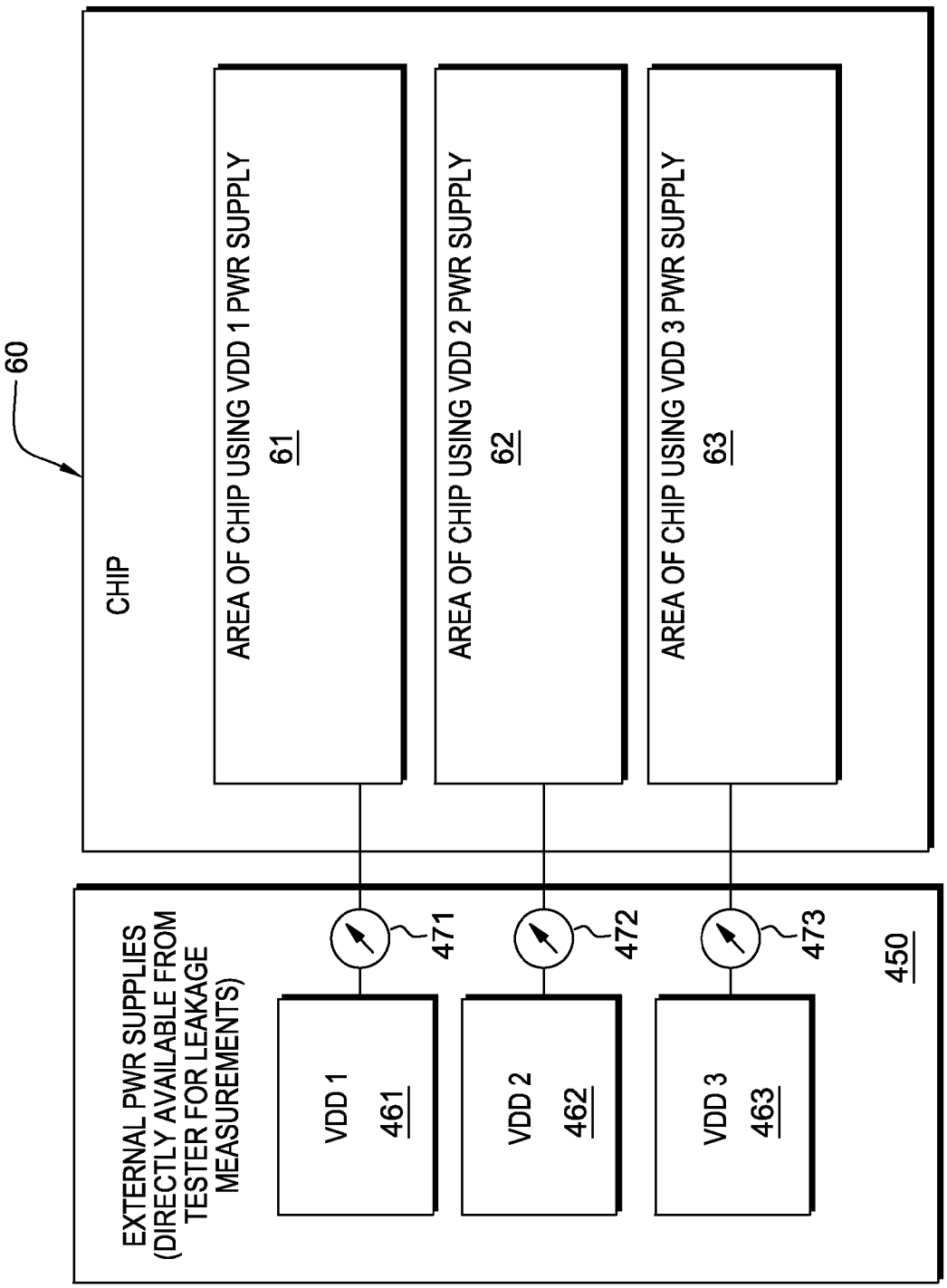
FIG. 12 shows an example IC chip 60 including certain functional areas adapted for Low V defect screening according to a further embodiment.

FIG. 12 shows an example IC chip itself 60 including certain functional areas including: an area of chip 61 that receives the $Vdd_1$ power supply voltage 461 from a respective conductor. As further shown in IC 60, are other chip circuit areas, e.g., chip area 62, 63 that normally each receive power, via respective conductors, from respective Vdd power supplies 462 ($Vdd_2$) and power supply 463 ($Vdd_3$) of the power supply test pad used for test leakage measurements. As shown in FIG. 12, the test apparatus further includes respective electric current meter devices 471, 472, 473 adapted to measure IC currents in respective chip areas 61, 62, 63 when performing low V defect screening. These meters are programmable so that chip current measurements may be taken of circuit chip voltage domains (e.g., areas 62, 63, 64), i.e., the Low V currents between may be measured.

Figure 13:
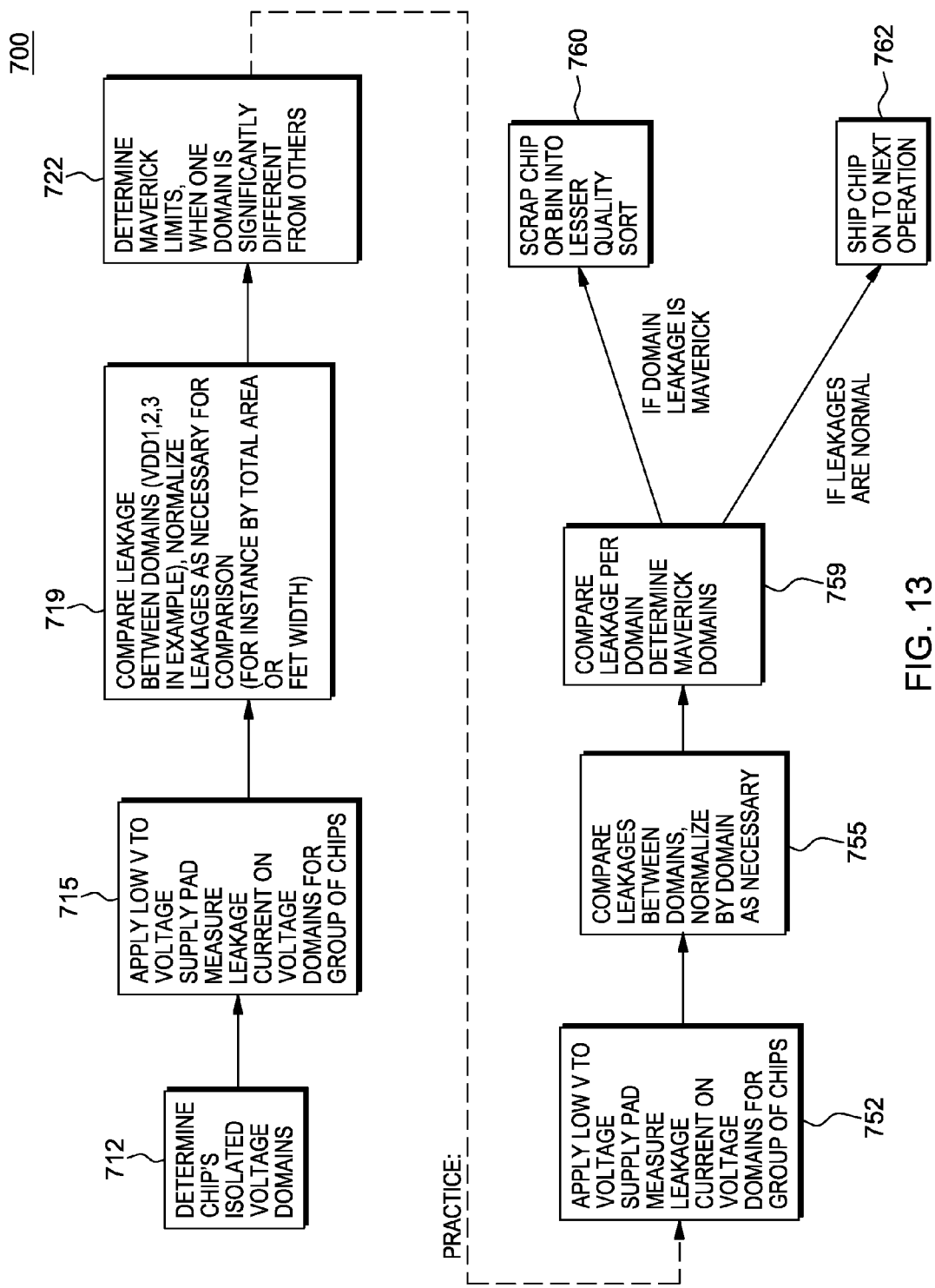
FIG. 13 depicts a method 700 of Low V IC testing of the IC chip 60 according to a further embodiment.

FIG. 13 depicts a method 700 of Low V IC testing of the IC chip 60 according to a further embodiment. The method 700 of Low V voltage IC testing is controlled by computing system 400 interfacing with IC tester 10 as shown in FIG. 1. Prior to IC testing, at 712, it may first be determined the chip's isolated voltage domain(s) to be tested. Commencing a microelectronic chip test, as indicated at 715, a Low V voltage is applied to a voltage supply pad 15, and the measurement device 25 of the tester 10 is programmed to measure leakage current on the voltage domain(s) for each domain (group of chips) tested at 715.

After measuring at the power supply value for each domain(s), the current supplied to the domain at 715, there is performed at 719 the comparison of the Leakage between domains (e.g., Vdd1, Vdd2, Vdd3 in the example IC 60 of FIG. 12), against normalize leakages as necessary for comparison (e.g., by total area or FET width). In one embodiment, for instance, this includes measuring an analog parameter, a total area or FET width that correlates well with the FET transistor strength. Then, for each chip, at 722, there is determined maverick limits, i.e., when one domain is significantly different from others.

As further shown in FIG. 13, a process is subsequently (routinely) used to screen out, or scrap, chips that are subsequently measured to have greater than the specified current limit for a given FET width or area. That is, after setting up the screen limit, in practice, during manufacturing, for each chip manufactured, there is performed: applying the Low V to that voltage domain or a group of chips at 752; then there is performed comparing the leakages between voltage domains, and normalizing by domain as necessary at 755.

Then at 759, there is performed a comparison of the leakage per voltage domain against the previously determined "Maverick" domains.

If a determination is made whether the measured current leakage value per domain is greater than the maverick limit and can be sorted out at 760, e.g., for scrap or for binning into a lesser quality sort, and/or disabling the leaky portion of the chip during operation if a chip is determined above the current limit, or whether the measured current leakage value per domain is less than the maverick limit and can be shipped for progression to a further operation at 762 if the chip is determined below the current limit.

This may also be performed for different instances of arrays.

Further, normalization factors can be based on historic data or circuit size can be used to compare leakage between different sized networks.

Figure 15:
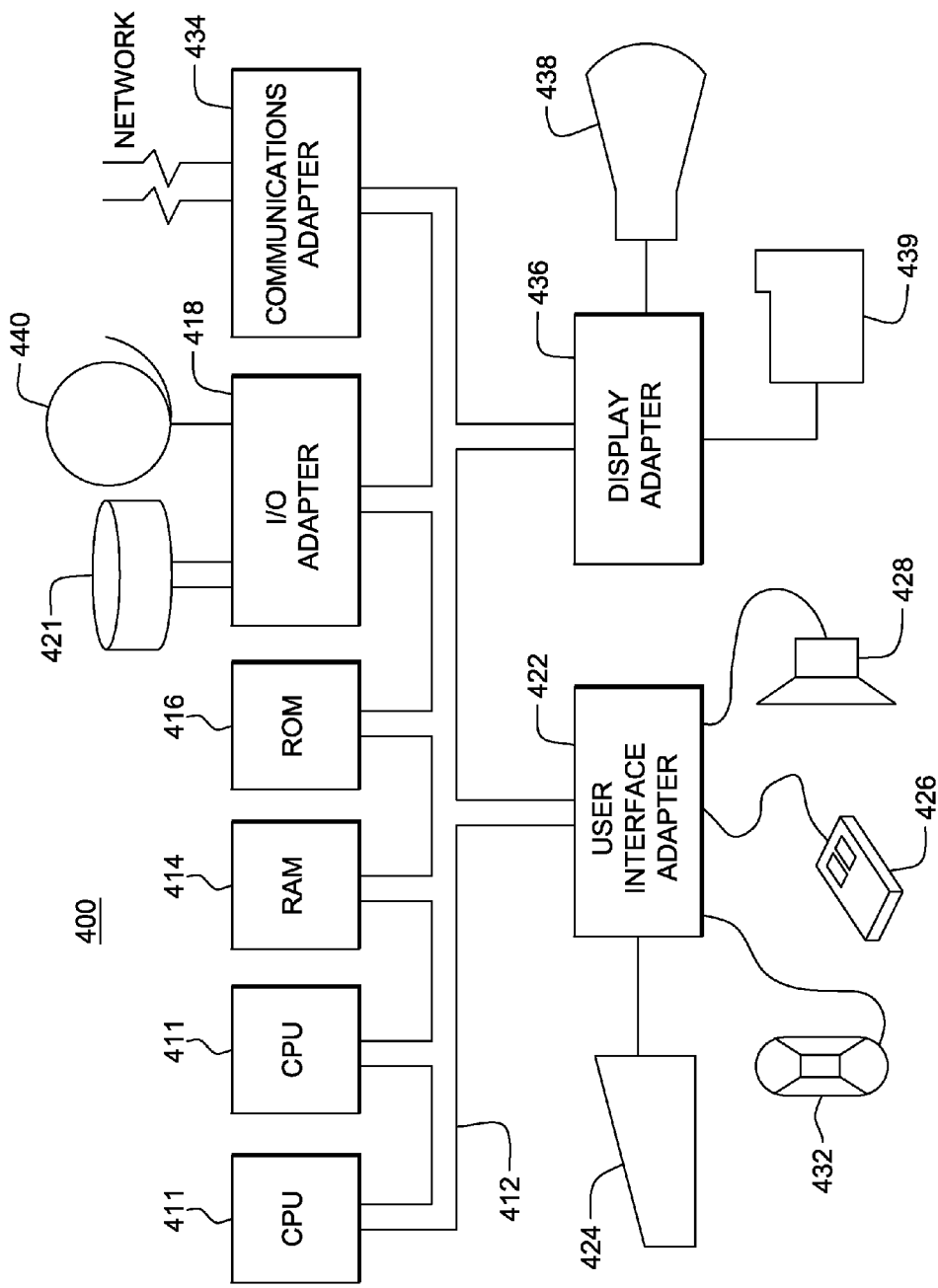
FIG. 15 shows a computing system 400 providing automated IC test programming according to the Low V defect screening methods described herein.

FIG. 15 illustrates an exemplary hardware configuration of a computing system 400 employed to conduct operations of the present system and method as shown in FIGS. 2, 6 and 13. The hardware configuration preferably has at least one processor or central processing unit (CPU) 411. The CPUs 411 are interconnected via a system bus 412 to a random access memory (RAM) 414, read-only memory (ROM) 416, input/output (I/O) adapter 418 (for connecting peripheral devices such as disk units 421 and tape drives 440 to the bus 412), user interface adapter 422 (for connecting a keyboard 424, mouse 426, speaker 428, microphone 432, and/or other user interface device to the bus 412), a communication adapter 434 for connecting the system 400 to a data processing network, the Internet, an Intranet, a local area network (LAN), etc., and a display adapter 436 for connecting the bus 412 to a display device 438 and/or printer 439 (e.g., a digital printer of the like).

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with a system, apparatus, or device running an instruction.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with a system, apparatus, or device running an instruction.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may run entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Thus, in one embodiment, the system and method for efficient passage retrieval may be performed with data structures native to various programming languages such as Java and C++.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which run via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which run on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more operable instructions for implementing the specified logical function(s). It should also be noted that, in some alternative implementations, the functions noted in the block may occur out of the order noted in the figures. For example, two blocks shown in succession may, in fact, be run substantially concurrently, or the blocks may sometimes be run in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The embodiments described above are illustrative examples and it should not be construed that the present invention is limited to these particular embodiments. Thus, various changes and modifications may be effected by one skilled in the art without departing from the spirit or scope of the invention as defined in the appended claims.

The invention claimed is:

1. A method for testing integrated circuits comprising:
receiving a voltage signal from an external voltage supply source of a value less than a threshold transistor turn on voltage of a circuit's transistors, at one or more signal inputs of a voltage domain provided in an integrated circuit;
measuring a current leakage at signal connectors of said voltage domain;
comparing the measured current leakage with a pre-determined current limit specification based on an independent parameter characterizing said chip; and
sorting said chip in response to said comparison, wherein said pre-determined current limit specification based on an independent parameter is prior obtained by:
applying a voltage signal from an external voltage supply source to a power connector of a circuit having transistor devices, said circuit associated with the voltage domain, said applied voltage signal of a value less than a threshold transistor turn on voltage of the circuit's transistors;
measuring a current leakage at said power connector of said voltage domain;
measuring said independent parameter associated with said voltage domain that correlates to a transistor device strength or an integrated circuit chip performance;
comparing the measured current leakage of said voltage domain to the associated measured independent parameter; and
creating a current limit specification normalized to the independent parameter that correlates with the transistor device strength or said chip performance.

2. The method as claimed in claim 1, wherein said independent parameter is a speed of the chip.

3. The method as claimed in claim 2, wherein said chip speed is measured by a circuit delay test.

4. The method as claimed in claim 3, wherein said circuit delay test employs a ring oscillator.

5. The method as claimed in claim 1, wherein said independent parameter is a speed of the chip obtained from a distribution of chip speed values obtained from a plurality of chips.

6. The method as in claim 1, wherein when the measured current leakage exceeds said pre-determined specification limit, said sorting comprises one or more of: aborting production of said chip, disabling the whole or a portion of the voltage domain chip, or binning said chip for less reliable use.

7. The method as in claim 1, wherein a voltage network domain includes an on-chip power header device, or an on-chip voltage generator device, said on-chip power header or voltage generator devices having associated circuitry receiving voltage supply power signals from the on-chip voltage generator or on-chip power header, said method further comprising:
configuring said IC to shunt the on-chip power header or voltage generator devices and provide a direct conductive connection to receive a test voltage signal directly from said external voltage supply source at one or more signal inputs of the associated circuitry.

8. The method as in claim 7, wherein said IC includes an on-chip switching device and associated logic device, said configuring said IC to shunt the on-chip power header or voltage generator devices comprises: configuring said logic to switch said on-chip switching device to provide said direct conductive connection.

9. The method as in claim 1, wherein said independent parameter is a minimum voltage that enables the chip to meet a frequency of operation specification, said comparing including comparing the leakage current to a Vmin measurement calculated by determining the minimum voltage that a chip can run and still pass a maximum frequency test.

10. A method for testing integrated circuits comprising:
receiving a first voltage signal of a value less than a threshold transistor turn on voltage of a circuit's transistors, at one or more signal inputs of a voltage network provided in an integrated circuit;
measuring a first current leakage at signal connectors of said voltage network on said voltage network;
applying a defect accelerating stress to said voltage network;
receiving a second voltage signal of a value less than a threshold transistor turn on voltage of a circuit's transistors, at one or more signal inputs of a voltage network provided in an integrated circuit;
measuring a second current leakage at said signal connectors of said voltage network on said voltage network;
comparing the first measured current leakage with said second measure current leakage; and
sorting said chip based on said comparing.

11. The method as claimed in claim 10, wherein said comparing comprises:
obtaining a difference between the first measured current leakage and second measured current leakage values; and
comparing said difference to a pre-specified limit, wherein when said second measured current leakage is determined less than the first to exceed said limit, said sorting comprises one or more of: aborting production of said chip, disabling the whole or a portion of the voltage domain chip, or binning said chip for less reliable use.

12. The method as claimed in claim 10, wherein said applying a high voltage stress comprises one of:
applying a power supply voltage greater than a normal operating power supply voltage value so as to cause a short circuit or open circuit defect in said voltage domain of said integrated circuit, or applying a defect accelerating high temperature stress to said voltage domain of said integrated circuit.

13. A system for testing integrated circuits (IC) comprising:
a voltage test device supporting an integrated circuit to be tested and having connections for inputting signals to and receiving signals from the integrated circuit;
a voltage source providing a voltage signal to said test device for application at one or more signal inputs of a voltage domain provided in said integrated circuit, a voltage signal applied having a value less than a threshold transistor turn on voltage of a circuit's transistors within the domain;
a current measurement device for measuring a current leakage at signal connectors of said voltage domain; and
a computing device receiving said measured current leakage values, comparing the measured current leakage values with a pre-determined current limit specification based on an independent parameter characterizing said chip, and indicating a sorting of said integrated chip in response to said comparison, wherein said pre-determined current limit specification based on an independent parameter is prior obtained by:
applying a voltage signal from an external voltage supply source to a power connector of a circuit having transistor devices, said circuit associated with the voltage domain, said applied voltage signal of a value less than a threshold transistor turn on voltage of the circuit's transistors;
measuring a current leakage at said power connector of said voltage domain;
measuring said independent parameter associated with said voltage domain that correlates to a transistor device strength or an integrated circuit chip performance; and
using said computing device to:
compare the measured current leakage of said voltage domain to the associated measured independent parameter; and
create a current limit specification normalized to the independent parameter that correlates with the transistor device strength or said chip performance.

14. The system as claimed in claim 13, wherein said independent parameter is a speed of the chip.

15. The system as claimed in claim 14, wherein said chip speed is measured by a circuit delay test, said circuit delay test employing a ring oscillator associated with said voltage network.

16. The system as claimed in claim 13, wherein a voltage network includes an on-chip power header device or an on-chip voltage generator device, said on-chip power header or voltage generator devices having associated circuitry receiving voltage supply power signals from the on-chip voltage generator or on-chip power header.

17. The system as claimed in claim 16, wherein said IC includes an on-chip switching device and associated logic device, said IC being configured to program said switching device to shunt the on-chip power header or voltage generator devices by configuring said logic device to switch said on-chip switching device to provide a direct conductive connection to receive a test voltage signal directly from said external voltage supply source.

18. A system for testing integrated circuits (IC) comprising:
a voltage test device supporting an integrated circuit to be tested and having connections for inputting signals to and receiving signals from the integrated circuit;
a voltage source providing a first voltage signal to said test device for application at one or more signal inputs of a voltage network provided in said integrated circuit, said first voltage signal applied having a value less than a threshold transistor turn on voltage of a circuit's transistors;
a current measurement device for measuring the first current leakage at signal connectors of said voltage network;
said voltage source applying a high voltage stress to said one or more signal inputs of said voltage network that is a defect accelerating voltage;
said voltage source further providing a second voltage signal of a value less than a threshold transistor turn on voltage of a circuit's transistors, at said one or more signal inputs of a voltage network provided in an integrated circuit;
said current measurement device measuring a second current leakage value at signal connectors of said voltage network;
a computer system for receiving said measured first current leakage values against said measured second current leakage values and comparing the measured first current leakage values against said measured second current leakage values; and
sorting said chip based on said comparing.

19. The system as claimed 18, wherein said comparing performed by said computer system comprises:
obtaining a difference between the first measured current leakage and second measured current leakage values; and
comparing said difference to a pre-specified limit, wherein when said second measured current leakage is determined less than the first to exceed said limit, said sorting comprises one or more of: aborting production of said chip, disabling the whole or a portion of the voltage domain chip, or binning said chip for less reliable use.

20. The system as claimed 18, wherein a voltage network includes an on-chip power header device or an on-chip voltage generator device.

* * * * *